United States Patent
Han (10) Patent No.: US 7,468,550 B2
(45) Date of Patent: Dec. 23, 2008

(54) HIGH-PERFORMANCE SEMICONDUCTOR PACKAGE

(75) Inventor: Kwon Whan Han, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 19 days.

(21) Appl. No.: 11/485,125

(22) Filed: Jul. 12, 2006

(65) Prior Publication Data

US 2007/0228563 A1    Oct. 4, 2007

(30) Foreign Application Priority Data

May 29, 2006    (KR) ............... 10-2006-0028522

(51) Int. Cl.
 *H01L 23/02*    (2006.01)
(52) U.S. Cl. ...................... 257/678; 257/781
(58) Field of Classification Search .......... 257/786, 257/777, 678, 691, 737, 778, 781; 438/106, 438/108, 118
See application file for complete search history.

(56) References Cited

U.S. PATENT DOCUMENTS 6,642,627 B2    11/2003 Song et al.
6,841,884 B2 *    1/2005 Shizuno ............ 257/777
7,005,752 B2 *    2/2006 Bojkov et al. ......... 257/786
2007/0262436 A1 *    11/2007 Kweon et al. ......... 257/686

FOREIGN PATENT DOCUMENTS

| JP | 11017048 | 1/1999 |
| KR | 1020017014252 | 11/2001 |
| KR | 10200300006915 A | 1/2003 |
| KR | 10-0532726 | 8/2004 |
| KR | 10-2005-001459 | 1/2005 |

OTHER PUBLICATIONS

Korean Patent Gazette from Korean Patent Office, May 7, 2007.

* cited by examiner

*Primary Examiner*—Tuan H Nguyen
(74) *Attorney, Agent, or Firm*—Ladas & Parry LLP

(57) ABSTRACT

A high-speed and high-performance semiconductor package reduces degradation of chip characteristics when chips are packaged. The semiconductor package includes a semiconductor chip including a plurality of bonding pads, a redistribution layer formed on the semiconductor chip while being connected with the bonding pads, a substrate attached to an upper surface of the semiconductor chip and formed with a window for exposing the redistribution layer, a connection member for electrically connecting the bonding pad of the semiconductor chip with the substrate, a sealing member for sealing the window including the connection member and a surface of the substrate including the semiconductor chip, solder balls attached to the substrate.

13 Claims, 8 Drawing Sheets

HIGH-PERFORMANCE SEMICONDUCTOR PACKAGE

FIELD OF THE INVENTION

The present invention relates to a semiconductor package. More particularly, the present invention relates to a high-speed and high-performance semiconductor package capable minimizing degradation of chip characteristics when chips have been packaged.

BACKGROUND OF THE INVENTION

Recently, a semiconductor device such as a dynamic random access memory or "DRAM" is fabricated such that is has a high integration operates at a high speed. In the case of high-speed and high-performance semiconductor chips, a low-voltage operational characteristic is required in order to reduce heat generated in the semiconductor chip caused by high power.

However, since most semiconductor chips are packaged by using an organic substrate and a wire bonding, chip characteristics are seriously degraded when the semiconductor chips have been packaged.

Figure 1:
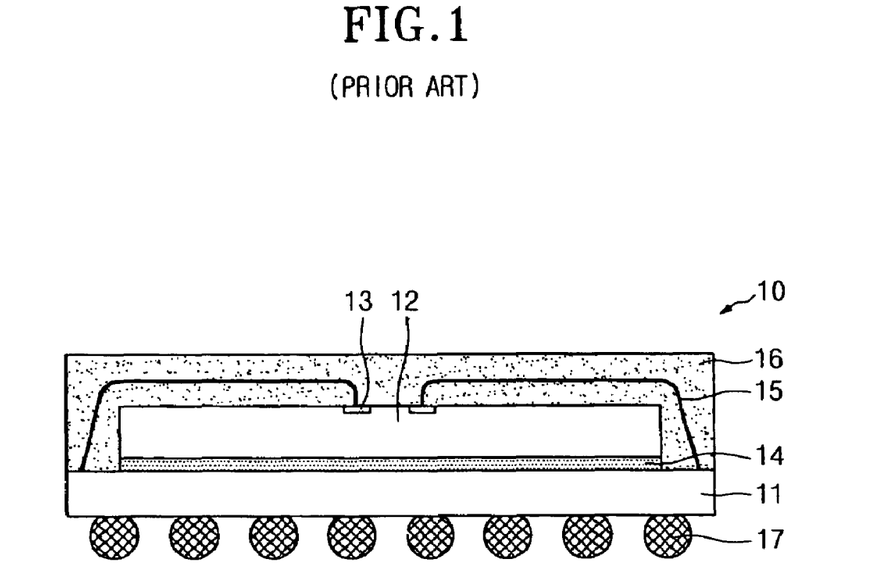
FIGS. 1 and 2 are sectional views illustrating conventional prior art semiconductor packages.
Figure 2:
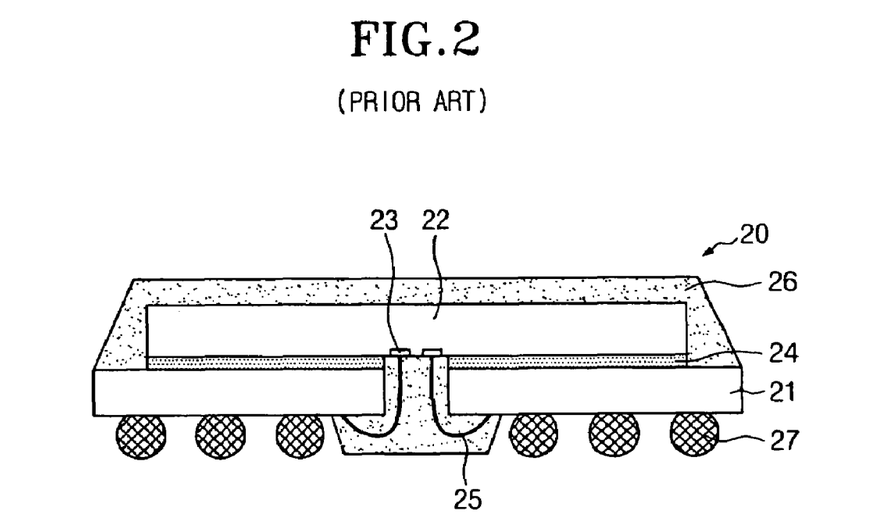

FIGS. 1 and 2 are sectional views illustrating conventional semiconductor packages. Hereinafter, problems of the conventional semiconductor packages will be described with reference to FIGS. 1 and 2.

FIG. 1 is a sectional view showing a face-up type FBGA (fine pitch ball grid array) package 10. As shown in FIG. 1, the face-up type FBGA package 10 may cause degradation of chip characteristics when a bonding wire 15, which electrically connects a semiconductor chip 12 with a substrate 12, has a long length.

In addition, FIG. 2 is a sectional view showing a face-down type FBGA package 20. As shown in FIG. 2, according to the face-down type FBGA package 20, left and right power lines are separated from each other by a window formed at the center portion of a substrate 21, so that power cannot be easily supplied into a semiconductor chip 22, causing degradation of the chip characteristics.

In FIGS. 1 and 2, reference numerals 13 and 23 represent bonding pads. Reference numerals 14 and 24 represent adhesives. Reference numerals 17 and 27 represent solder balls and reference numeral 25 represent the bonding wire, respectively.

Meanwhile, a high-speed and high-performance semiconductor chip is generally fabricated such that it has a plurality of aluminum bonding pads. However, in the case of the high-speed and high-performance semiconductor chip having a plurality of aluminum bonding pads, it is impossible to perform the wire bonding process for all aluminum bonding pads in the substrate due to the limitation of the package size. In order to solve the above problem, a bonding option of a power pin has been suggested. However, this may cause degradation of electric characteristics of the package. In short, the high-speed and high-performance semiconductor chip also represents the characteristic degradation in the package.

In addition, although a multiple substrate has been suggested in order to solve the above problem, it may cause a warpage of the package and migration of copper ions, thereby lowering reliability of the package, so the multiple substrate is rarely used in practice.

SUMMARY OF THE INVENTION

Accordingly, an object of the present invention is to provide a semiconductor package capable of reducing or minimizing degradation of chip characteristics when chips have been packaged.

Another object of the present invention is to provide a semiconductor package suitable for high-speed and high-performance semiconductor chips by improving the line characteristic of each pin.

In order to accomplish these and other objects, there is provided a semiconductor package comprising: a semiconductor chip including a plurality of bonding pads; a redistribution layer formed on the semiconductor chip while being connected with the bonding pads; a substrate attached to an upper surface of the semiconductor chip and formed with a window for exposing the redistribution layer; a connection member for electrically connecting the bonding pad of the semiconductor chip with the substrate; a sealing member for sealing the window including the connection member and a surface of the substrate including the semiconductor chip; and solder balls attached to the substrate.

According to the preferred embodiment of the present invention, the semiconductor chip is a center pad type chip, which is formed on a center of an upper surface thereof with bonding pads.

The semiconductor chip is formed at an upper surface thereof with an insulating layer having an opening for exposing bonding pads and spaces formed between the bonding pads, and the redistribution layer is formed on the insulating layer while being connected to the bonding pads.

The redistribution layer has a stacked structure consisting of a seed metal layer and a wiring metal layer stacked on the seed metal layer.

The wiring metal layer has a stacked structure, in which an uppermost layer thereof is an Au layer. For instance, the wiring metal layer has a stacked structure consisting of Cu/Ni/Au or Cu/Au.

The substrate is attached to the semiconductor chip by means of an adhesive material, such as an adhesive tape or epoxy.

The substrate has a size larger than that of the semiconductor chip.

The connection member includes a bonding wire.

In addition, the connection member includes a solder bump, which connects the semiconductor chip with the substrate in a flip chip bonding manner.

The semiconductor package further comprises a protective layer formed on the semiconductor chip, wherein the protective layer covers the redistribution layer, except for a predetermined portion of the redistribution layer, and an upper surface of the semiconductor chip.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description and drawings, the same reference numerals are used to designate the same or similar components, so repetition of the description on the same or similar components will be omitted.

Figure 3:
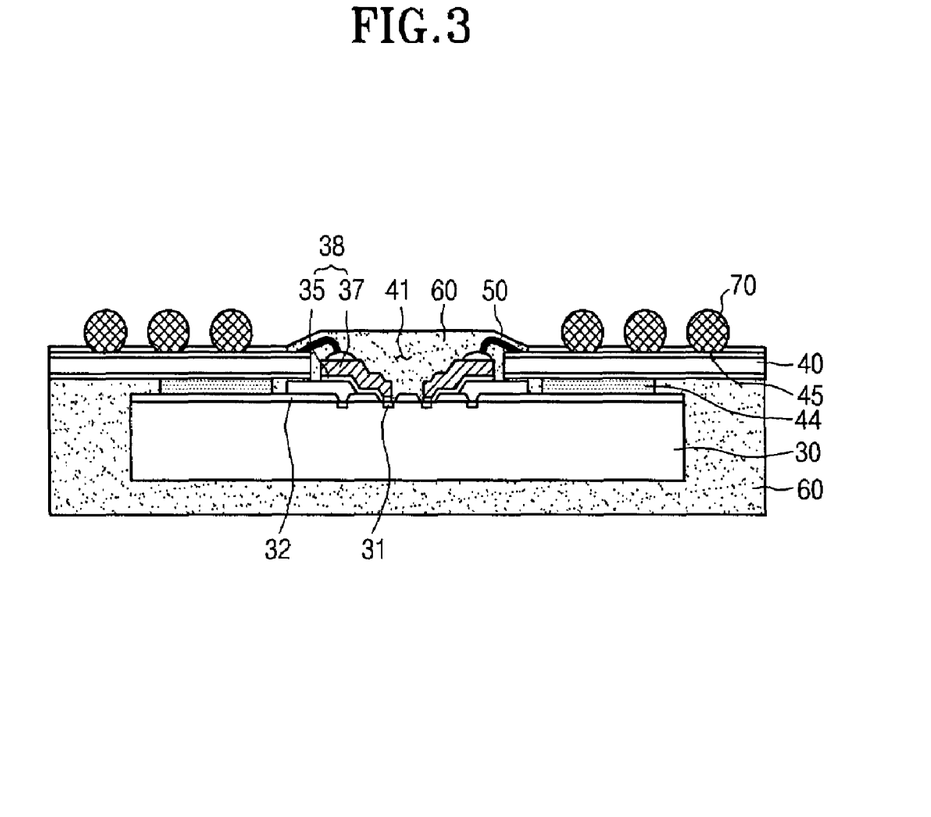
FIG. 3 is a sectional view illustrating a semiconductor package according to one embodiment of the present invention.

FIG. 3 is a sectional view illustrating the semiconductor package according to one embodiment of the present invention. As shown in FIG. 3, the semiconductor package includes a semiconductor chip 30 having a plurality of bonding pads 31, a substrate 40 having a redistribution layer 38 connected to the bonding pads 31 provided on the semiconductor chip 30 and a window 41 attached to the upper surface of the semiconductor chip 30 so as to expose the redistribution layer 38, a bonding wire 50 for electrically connecting the redistribution layer 38 with the substrate 40, a sealing member 60 for sealing a window part of the substrate 40 including the bonding wire 50 and the upper surface of the substrate including the semiconductor chip 30. FIG. 3 also shows a plurality of solder balls 70 attached to the substrate 40.

In one example, the semiconductor chip 30 is a center pad type chip, which is formed on the center of an upper surface thereof with bonding pads 31. The redistribution layer 38 is formed on an insulating layer 32, which expose the bonding pads 31 of the semiconductor chip 30. The redistribution layer 38 includes a seed metal layer 35 and a wiring metal layer 37, which is stacked on the seed metal layer 35 through a plating process. In addition, the redistribution layer 38 has a pad section connected to the bonding wire.

The substrate 40 has the window 41 for exposing the redistribution layer 38 provided on the semiconductor chip 30. In addition, the substrate 40 includes a circuit pattern 43 and a ball land 45. The substrate 40 is attached to the upper surface of the semiconductor chip 30 by means of an adhesive material 44, such as an adhesive tape or epoxy.

The bonding wire 50 electrically connects the pad section of the redistribution layer 38 with the circuit pattern 43 of the substrate 40. The solder ball 70 is used for mounting the semiconductor package on an external circuit and is attached to the ball land 45 of the substrate 40.

The semiconductor package having the above structure according to the present invention has at least following advantages over prior art packages.

Figure 4:
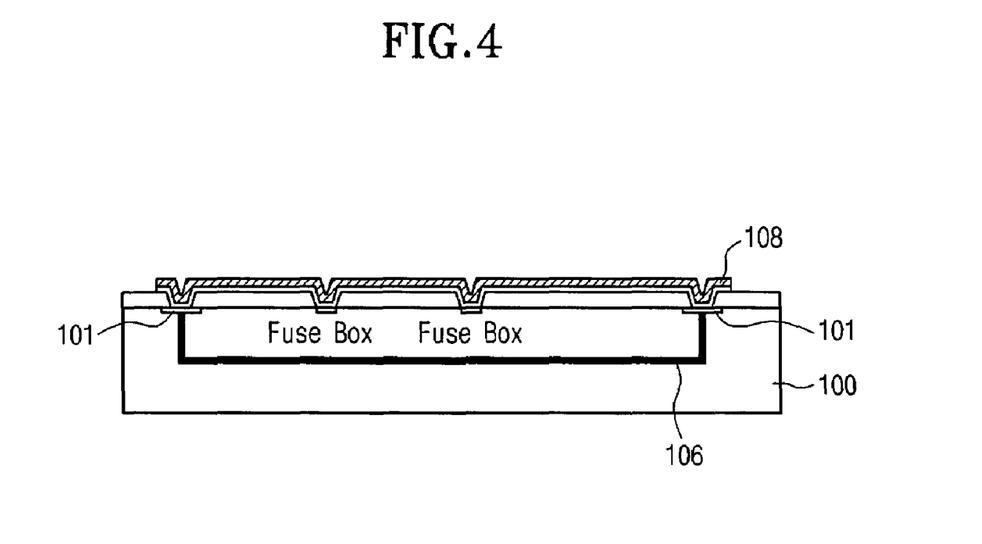
FIGS. 4 and 5 are views of a semiconductor package according to one embodiment of the present invention.

As shown in FIG. 4, according to the present invention, bonding pads 101, which have been previously formed during the semiconductor manufacturing process, are redistributed in a predetermined pattern by performing the redistribution process at the wafer level. For instance, bonding pads 101 having the same function are connected with each other through a redistribution layer 108. In this case, the semiconductor package according to the present invention can improve power-ground characteristics. In particular, power supply pins, that is, the bonding pads 101 serving as the pins for carrying power into the semiconductor device are interconnected at the inside of the semiconductor chip 100 through a connection pattern 106 and are interconnected at the outside of the semiconductor chip through the redistribution layer 108, thereby forming a parallel circuit. Thus, the semiconductor package according to the present invention can reduce the resistance and inductance in paths through which supply power flows, thereby reducing the total impedance of the semiconductor package.

Figure 5:
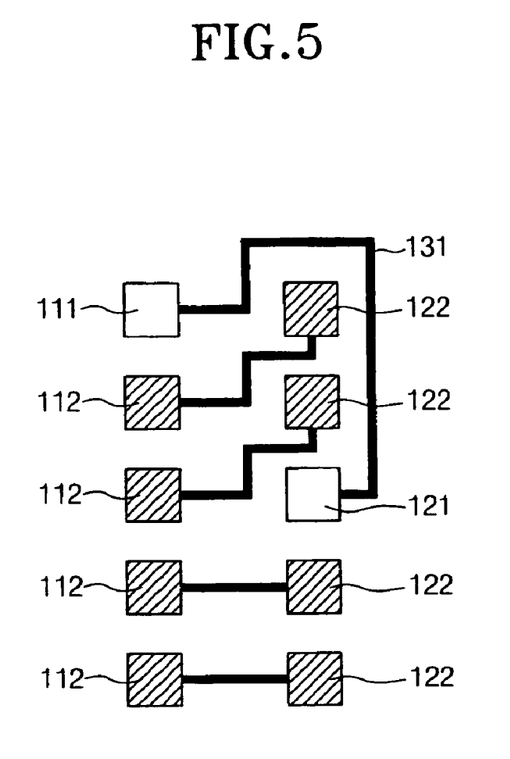

In addition, the present invention can optimize a signal connection in the substrate by means of redistributed pads, thereby improving transmission characteristics between a semiconductor device and a system. That is, as shown in FIG. 5, in the case of left pads 111 and 112, the power pad 111 is biased toward one direction from the signal pads 111. In contrast, right pads 121 and 122 are desirably aligned by means of the redistribution wire 131, so that signals transmitted from the right pads 121 and 122 may pass through a substrate (not shown) with superior transmission characteristics.

In addition, the high-speed device may require a greater number of power pads, causing difficulty in wire bonding work for the power pads. However, according to the present invention, the power pads are interconnected through the redistribution process, so that it is not necessary to perform the wire bonding work with respect to all power pads. Thus, it is possible to fabricate the substrate with various designs. In other words, the wire bonding work is performed with respect to some of the power pins having the same function after redistributing the power pins or adjusting the position of the power pins.

According to the present invention, a power-ground of the power pin is formed on the semiconductor chip, so that capacitance of the power pin is increased, thereby reducing noise when supplying power. Although the power-ground of the power pin can be formed on the substrate, it is preferred in view of efficiency to form the power-ground on the semiconductor chip.

Furthermore, although it will be described in detail later, since the redistribution and packaging processes are performed at the wafer level, the semiconductor package according to the present invention may have the following advantages, which are not expected from the conventional semiconductor package having power pins interconnected through the substrate.

First, the present invention can effectively interconnect the power pins as compared with a conventional connection method using the substrate. Second, if the power pins are interconnected through the substrate, it is necessary to provide a multiple substrate in order to efficiently interconnect the power pins. However, the multiple substrate may cause various problems, such as warpage of the semiconductor package, etc., thereby lowering the reliability of the semiconductor package. However, the present invention can effectively interconnect the power pins without using the multiple substrate, so that the above problems may not occur. Third, when a sufficient number of net dies is provided, the present invention can save the cost when comparing with a case using the multiple substrate. Fourth, in the case of the face-down type semiconductor package, power lines cannot be interconnected or must be indirectly interconnected due to a wire bonding window. However, according to the present invention, the power lines are interconnected on the semiconductor chip, so that the process for interconnecting the power lines can be simplified. Fifth, the capacitor characteristic of the power plane formed on the semiconductor chip is significantly greater than that of the power plane formed on the substrate. This is because an interval between chip metals or between redistribution metals becomes reduced, so that the capacitance is increased by ten times or more.

Hereinafter, the process for manufacturing the semiconductor package according to the present invention will be described with reference to FIGS. 6A to 6F.

Figure 6A:
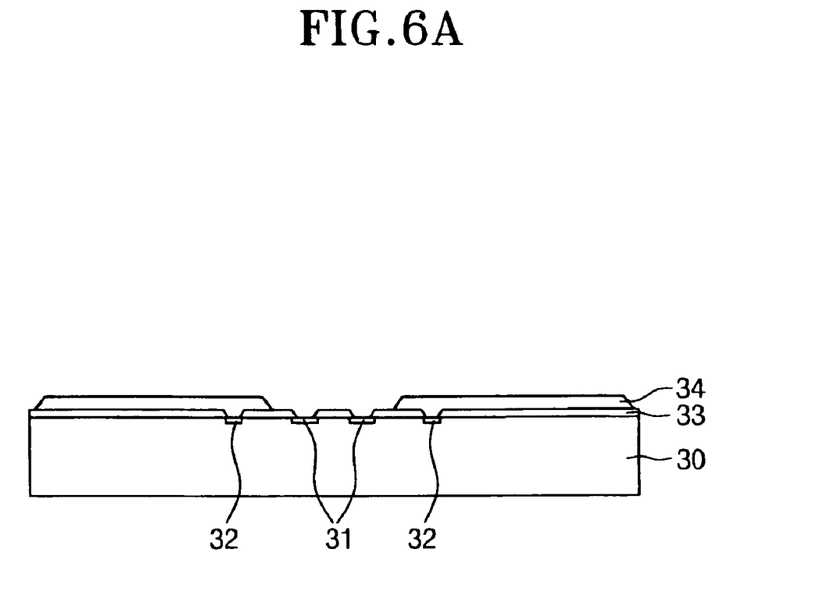
FIGS. 6A to 6F are sectional views illustrating the procedure for manufacturing a semiconductor package according to one embodiment of the present invention.

Referring to FIG. 6A, a wafer consisting of several semiconductor chips 30 is prepared. The semiconductor chip 30 is a center pad type chip, which is formed on the center of an upper surface thereof with bonding pads 31. Fuse boxes 32 are provided at the outside of the bonding pads 31. In addition, the semiconductor chip 30 is covered with a chip protective layer 33, except for the bonding pads 31 and the fuse boxes 32.

The insulating layer 34 is formed on the semiconductor chip 30 and then the insulating layer 34 is etched at the wafer level, thereby exposing the bonding pads 31 and spaces formed between the bonding pads 31.

Figure 6B:
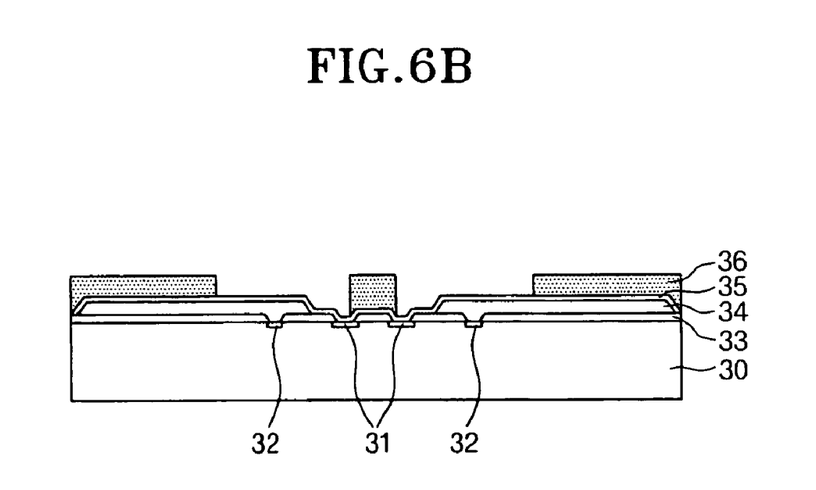

Referring to FIG. 6B, the seed metal layer 35 forming the redistribution layer is deposited on the insulating layer 34 including the exposed bonding pads 31. After that, a typical photolithography process is performed in order to form a plating film, that is, a photoresist film pattern 36, which exposes a region where the redistribution layer is formed later, on an upper surface of the seed metal layer 35. At this time, the photoresist film pattern 36 preferably has a thickness corresponding to a thickness of a metal layer to be plated.

Figure 6C:
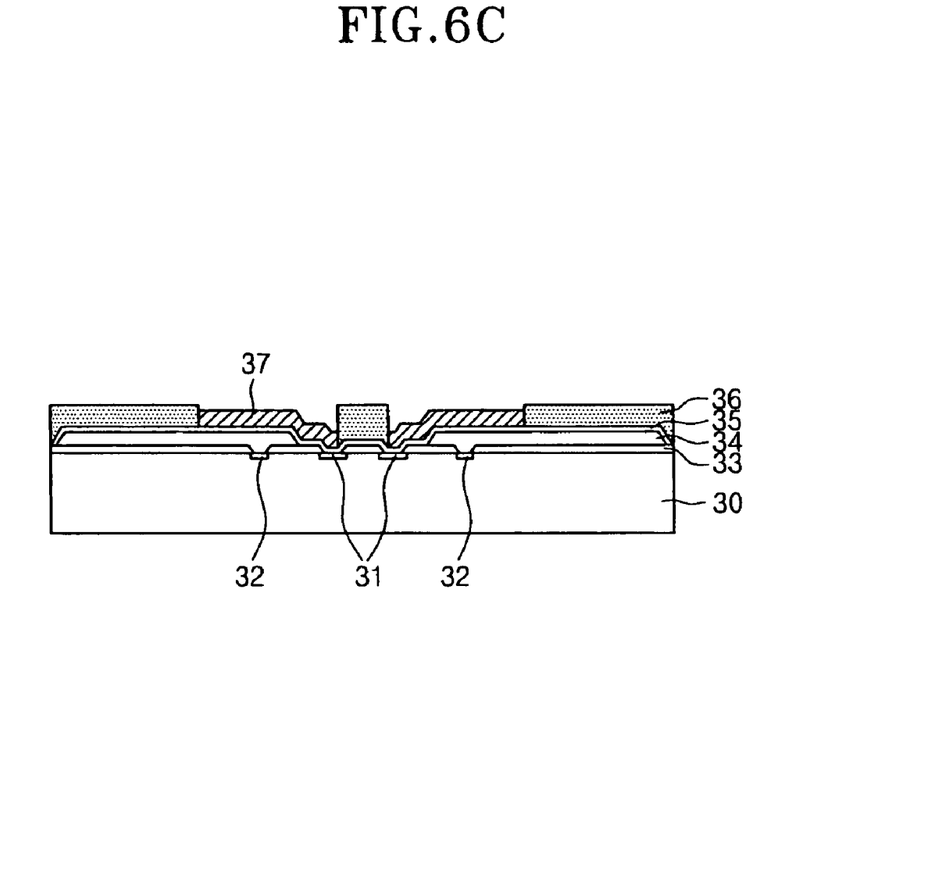

Referring to FIG. 6C, a plating process is performed in order to form the redistribution metal layer 37 on the exposed seed metal layer. At this time, the redistribution metal layer has a stacked structure of Cu/Ni/Au or Cu/Au, in which the Au layer is aligned in the uppermost layer so as to facilitate the wire bonding work.

Figure 6D:
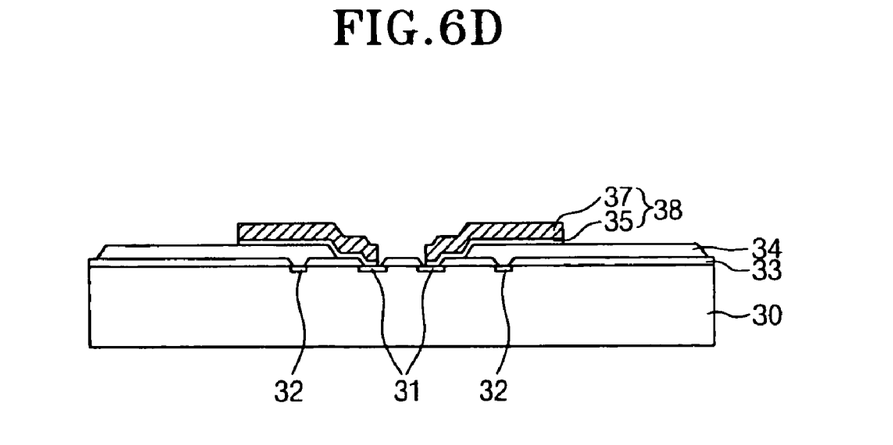

Referring to FIG. 6D, the photoresist film pattern is removed by performing a typical photoresist strip process. Then, the seed metal layer 35 is etched such that wirings are separated from each other, thereby forming the redistribution layer 38, in which one end of the redistribution layer 38 is connected to the bonding pad 31 of the semiconductor chip 30 and the other end of the redistribution layer 38 is formed with the pad section.

Figure 6E:
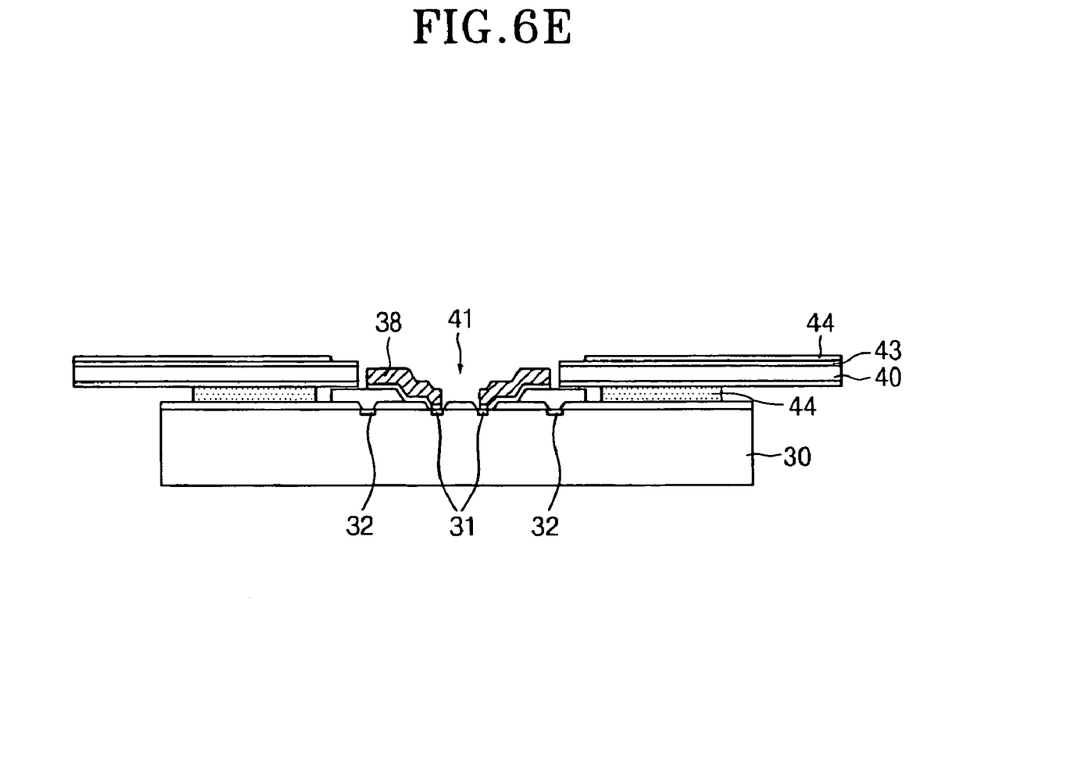

Referring to FIG. 6E, a sawing process is performed in order to divide the semiconductor chip 30, in which the redistribution layer 38 has been formed at the wafer level, into individual chips. After that, the substrate 40 having the window 41 exposing the redistribution layer 38 is attached to the semiconductor chip 30 by using the adhesive material 44, such as an adhesive tape or epoxy. Herein, the substrate 40 includes an insulating film formed with the circuit pattern 43 and is covered with the insulating layer 44, except for a portion of the circuit pattern 43, that is, the ball land. Then, the wire bonding process is performed so as to connect the pad section of the redistribution layer 38 with the circuit pattern 43 of the substrate 40 using the bonding wire 50.

Figure 6F:
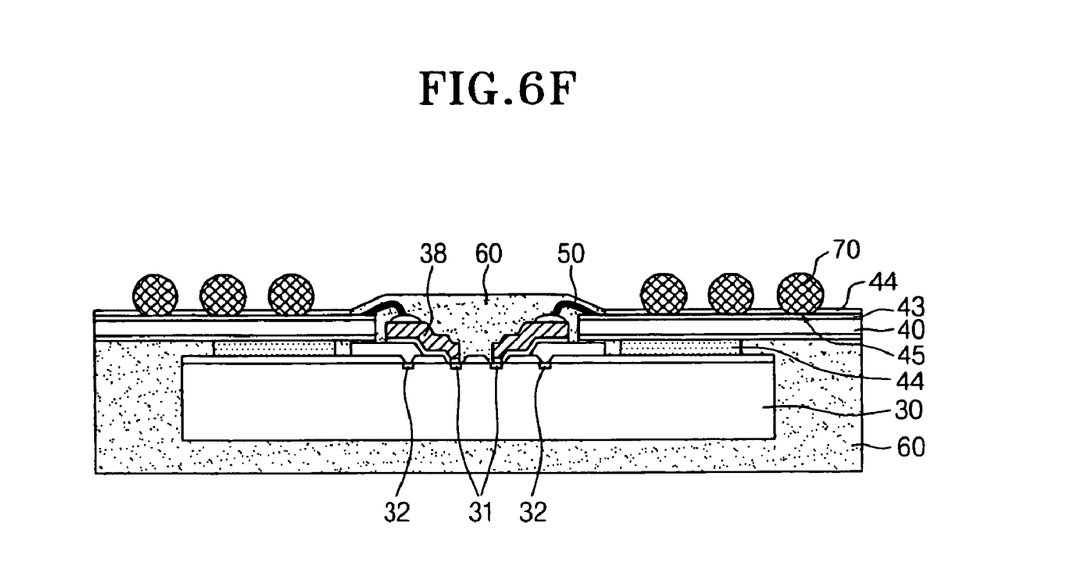

Referring to FIG. 6F, the sealing member 60 is formed on the surface of the substrate 40 including the window and the semiconductor chip 30 in order to protect the bonding wire 50, the redistribution layer 38 and the semiconductor chip 30 from external impact. After that, the solder balls 70 are attached to the ball land 45 of the substrate 40, thereby obtaining the semiconductor package according to the present invention.

Figure 7:
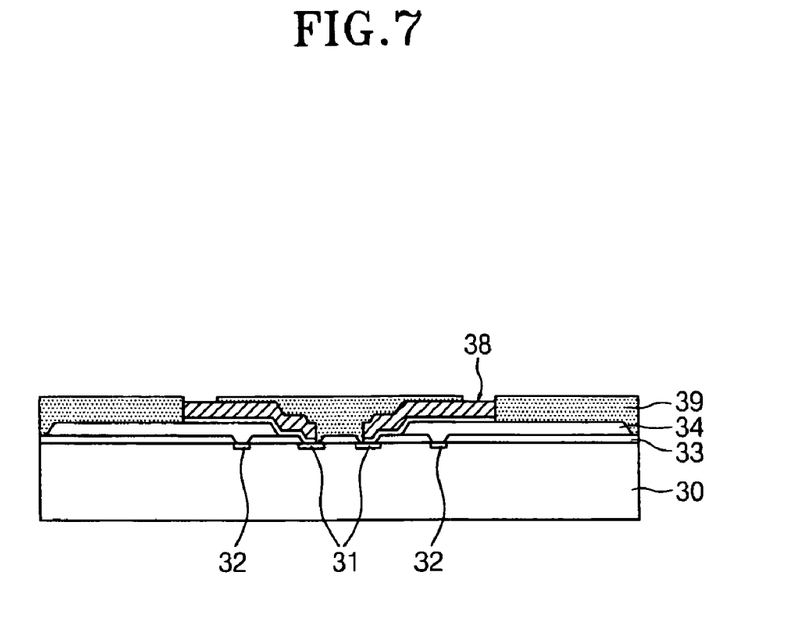
FIGS. 7 to 9 are sectional views illustrating a semiconductor package according to another embodiment of the present invention.

Although the above embodiment has been described that the substrate 40 is attached to the semiconductor chip 30, as shown in FIG. 6E, after forming the redistribution layer 38 during the packaging process, according to another embodiment of the present invention, as shown in FIG. 7, it is also possible to form the protective layer 39 on the upper surface of the semiconductor chip 30 after forming the redistribution layer 38 on the semiconductor chip 30 in order to protect the redistribution layer 38. In this case, the redistribution process is completed by etching the protective layer 39, in such a manner that a part of the redistribution layer 38, that is, the pad section formed on the other end of the redistribution layer 38, which is not connected to the bonding pad 31 of the semiconductor chip 30, can be exposed to the exterior.

Figure 8:
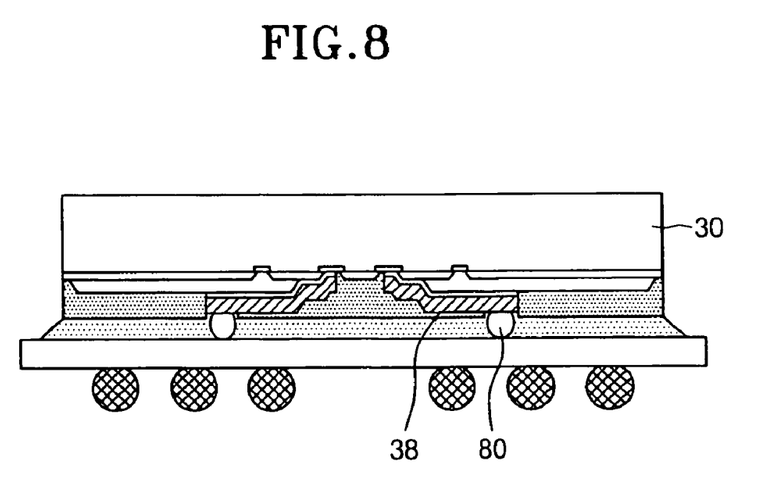

In addition, although the above embodiment employs the wire bonding in order to electrically connect the redistribution layer with the substrate, according to another embodiment of the present invention, as shown in FIG. 8, such an electrical connection can be achieved by using a flip chip bonding. In FIG. 8, reference numeral 80 represents a solder bump.

Figure 9:
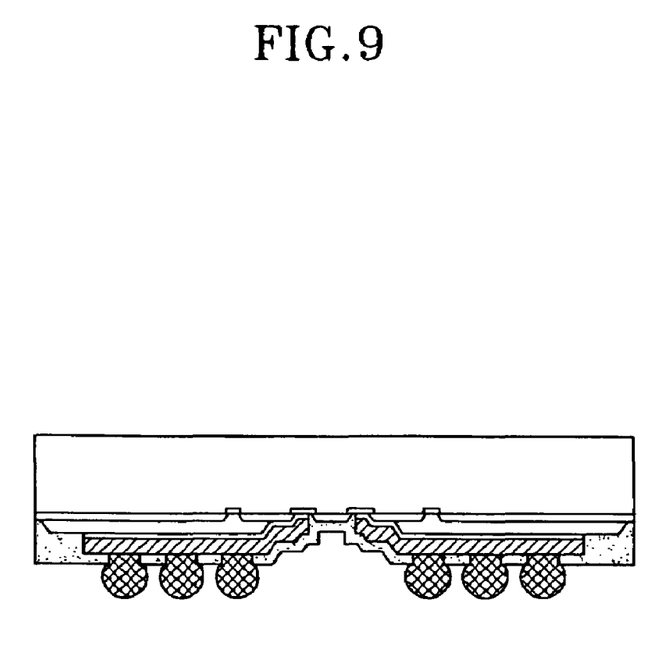

Furthermore, although the above embodiment has been described that the packaging process is performed in a chip level, according to another embodiment of the present invention, as shown in FIG. 9, it is also possible to fabricate the semiconductor package in the form of a wafer level chip size package.

Herein, detailed description for the semiconductor package obtained by using the flip chip bonding, and the wafer level chip size package will be omitted.

As described above, according to the present invention, the redistribution process is performed at the wafer level, thereby obtaining an optimal circuit connection, and the semiconductor chip having the optimal circuit connection is packaged, thereby obtaining the high-speed and high-performance semiconductor package.

In addition, different from the prior art, which obtains the circuit connection by using the substrate, the present invention optimizes the circuit connection by using the redistribution layer, so that the semiconductor package according to the present invention can effectively minimize degradation of chip characteristics while achieving superior package characteristics.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
   a semiconductor chip including a plurality of bonding pads;
   an electrically conductive redistribution layer formed on the semiconductor chip while being connected with the bonding pads, said electrically conductive redistribution layer being comprised of a redistribution metal layer over a seed metal layer;
   a substrate attached to an upper surface of the semiconductor chip and formed with a window for exposing the redistribution layer;
   a connection member, electrically connecting the bonding pad of the semiconductor chip with the substrate;
   an electrically non-conductive sealing member, substantially filling and sealing the window including the connection member and a surface of the substrate including the semiconductor chip; and
   solder balls attached to the substrate.

2. The semiconductor package as claimed in claim 1, wherein the semiconductor chip is a center pad type chip, which is formed on a center of an upper surface thereof with bonding pads.

3. The semiconductor package as claimed in claim 1, wherein the semiconductor chip is formed at an upper surface thereof with an insulating layer having an opening, which exposes bonding pads and spaces formed between the bonding pads, and the redistribution layer is formed on the insulating layer while being connected to the bonding pads.

4. The semiconductor package as claimed in claim 1, wherein the redistribution layer has a stacked structure consisting of a seed metal layer and a wiring metal layer stacked on the seed metal layer.

5. The semiconductor package as claimed in claim 4, wherein the wiring metal layer has a stacked structure, in which an uppermost layer thereof is an Au layer.

6. The semiconductor package as claimed in claim 5, wherein the wiring metal layer has a stacked structure consisting of Cu/Ni/Au or Cu/Au.

7. The semiconductor package as claimed in claim 1, wherein the substrate is attached to the semiconductor chip by means of an adhesive material.

8. The semiconductor package as claimed in claim 7, wherein the adhesive material includes an adhesive tape or epoxy.

9. The semiconductor package as claimed in claim 1, wherein the substrate has a size larger than that of the semiconductor chip.

10. The semiconductor package as claimed in claim 1, wherein the connection member includes a bonding wire.

11. The semiconductor package as claimed in claim 1, wherein the connection member includes a solder bump.

12. The semiconductor package as claimed in claim 11, wherein the semiconductor chip is flip-chip bonded to the substrate by means of the solder bump.

13. The semiconductor package as claimed in claim 1, further comprising a protective layer formed on the semiconductor chip, wherein the protective layer covers the redistribution layer, except for a predetermined portion of the redistribution layer, and an upper surface of the semiconductor chip.

* * * * *